United States Patent
Costa et al.

(10) Patent No.: US 8,112,695 B2
(45) Date of Patent: Feb. 7, 2012

(54) METHOD FOR ENCODING DATA MESSAGE K' FOR TRANSMISSION FROM SENDING STATION TO RECEIVING STATION AS WELL AS METHOD FOR DECODING, SENDING STATION, RECEIVING STATION AND SOFTWARE

(75) Inventors: Elena Costa, München (DE); Egon Schulz, München (DE); Petr Trifonov, St. Petersburg (RU)

(73) Assignee: Nokia Siemens Networks GmbH & Co. KG, Munich (DE)

( * ) Notice: Subject to any disclaimer, the term of this patent is extended or adjusted under 35 U.S.C. 154(b) by 654 days.

(21) Appl. No.: 12/226,776

(22) PCT Filed: Apr. 26, 2007

(86) PCT No.: PCT/EP2007/054101
§ 371 (c)(1),
(2), (4) Date: Feb. 24, 2009

(87) PCT Pub. No.: WO2007/125076
PCT Pub. Date: Nov. 8, 2007

(65) Prior Publication Data
US 2009/0204876 A1      Aug. 13, 2009

(30) Foreign Application Priority Data
Apr. 28, 2006   (EP) ..................... 06008954

(51) Int. Cl.
*G06F 11/00*   (2006.01)
(52) U.S. Cl. ........................ 714/781; 714/801

(58) Field of Classification Search .................. 714/781, 714/759, 772, 756, 755, 801
See application file for complete search history.

(56) References Cited

U.S. PATENT DOCUMENTS

| 7,581,162 B2 * | 8/2009 | Eroz et al. ..................... 714/800 |
| 7,966,548 B2 * | 6/2011 | Jacobsen et al. ............... 714/774 |
| 2007/0101233 A1 * | 5/2007 | Eroz et al. ..................... 714/758 |

FOREIGN PATENT DOCUMENTS
WO      2006/020484 A1    2/2006

OTHER PUBLICATIONS

L. Dinoi et al., "Design of variable-rate irregular LDPC codes with low error floor", 2005 IEEE International Conference on Communications (ICC 2005), May 2005, pp. 647-651.
L. Dinoi et al.;"Design of Variable-rate Irregular LDPC Codes with Low Error Floor"; 2005 IEEE International Conference on Communications (ICC 2005); 2005; vol. 1; pp. 647-651.

(Continued)

*Primary Examiner* — Dieu-Minh Le
(74) *Attorney, Agent, or Firm* — Staas & Halsey LLP

(57) ABSTRACT

Irregular LDPC codes have a construction which allows one to obtain a number of codes with different length from a single prototype code with a parity check matrix given by H=[Hz Hi], where Hz specifies the well-known zigzag pattern in the corresponding Tanner graph. The parity check matrices for longer codes are obtained as [Hz'Πdiag(Hi, . . . , Hi)], where Hz' specifies a longer zigzag pattern depending on the number of matrices Hi used, and Π represents some permutation. This allows one to construct the decoder for a longer code by reusing hardware components developed for decoding the prototype code.

12 Claims, 6 Drawing Sheets

OTHER PUBLICATIONS

T. Richardson et al; "Design of Capacity-Approaching Irregular Low-Density Parity-Check Codes"; IEEE Transactions on Information Theory, vol. 47. No. 2, Feb. 2001; pp. 619-637.

Y. Kou et al.; "Low-Density Parity-Check Codes Based on Finite Geometries: A Rediscovery and New Results"; IEEE Transactions on Information Theory, vol. 47, No. 7, Nov. 2001, pp. 2711-2736.

S. Johnson et al.; "Resolvable 2-Designs for Regular Low-Density Parity-Check Codes"; IEEE Transactions on Communications, vol. 51, No. 9, Sep. 2003, pp. 1413-1419.

X. Hu et al.; "Regular and Irregular Progressive Edge-Growth Tanner Graphs", IEEE Transaction on Information Theory, vol. 51, No. 1, Jan. 2005; pp. 386-398.

T. Tian et al.; "Selective Avoidance of Cycles in Irregular LDPC Code Construction"; IEEE Transactions on Communications, vol. 52, No. 8, Aug. 2004, pp. 1242-1247.

H. Xiao et al.; "Improved Progressive-Edge-Growth (PEG) Construction of Irregular LDPC Codes"; IEEE Communications Letters, vol. 8, No. 12, Dec. 2004, pp. 715-717.

D. Hocevar; "LDPC Code Construction with Flexible Hardware Implementation"; IEEE International Conference on Communications (ICC 2003); May 2003, vol. 1 of 5, pp. 2708-2712.

J. Kang et al.; "Flexible Construction of Irregular Partitioned Permutation LDPC Codes With Low Error Floors"; IEEE Communications Letters, vol. 9, No. 6, Jun. 2005, pp. 534-536.

W. Ryan et al.; "An Introduction to LDPC Codes"; Aug. 2003; printed from www.cseee,www.edu/wcrl/dpc.htm; 23 pp.

S. Chung et al.; "On the Design of Low-Density Parity-Check Codes within 0.0045 dB of the Shannon Limit", IEEE Communication Letters, vol. 5, No. 2, Feb. 2001; pp. 58-60.

A. Ramamoorthy et al.; "Analysis of an Algorithm for Irregular LDPC Code Constructions"; ISIT 2004; Jul. 2004, p. 70.

M. Foosorier; "Quasi-Cyclic Low-Density Parity-Check Codes From Circulant Permutation Matrices"; IEEE Transactions on Information Theory, vol. 50, No. 8, Aug. 2004; pp. 1788-1793.

R. Echard et al.; "Design Considerations Leading to the Development of Good π-Rotation LDPC Codes"; IEEE Communications Letter, vol. 9, No. 5, May 2005; pp. 447-449.

R. Tanner et al.; "LDPC Block and Convulational Codes Based on Circulant Matrices", IEEE Transactions on Information Theory, vol. 50, No. 12, Dec. 2004; pp. 2966-2984.

B. Ammar et al.; "Construction of Low-Density Parity-Check Codes Based on Balanced Incomplete Block Designs"; IEEE Transactions on Information Theory, vol. 50, No. 6, Jun. 2004; pp. 1257-1268.

B. Classon et al.; "LDPC Coding for OFDMA PHY"; IEEE 80216 Broadband Wireless Access Working Group; Jan. 2005; printed from ieee802.ort/16; pp. 0-15.

L. Ping et al., "Low density parity check codes with semi-random parity check matrix"; Electronics Letters, Jan. 1999, vol. 35, No. 1; 1 pg.

* cited by examiner

FIG 5

$$P = \begin{pmatrix}
23 & \infty & \infty & \infty & \infty & \infty & 9 & \infty & \infty & \infty & \infty & \infty & 6 & \infty & \infty & 21 & \infty & 24 \\
0 & \infty & \infty & \infty & \infty & \infty & \infty & 26 & \infty & \infty & \infty & \infty & \infty & 11 & \infty & 16 & \infty & 25 \\
27 & \infty & \infty & \infty & \infty & \infty & \infty & \infty & 1 & \infty & \infty & \infty & \infty & 24 & \infty & 26 & \infty & 14 \\
\infty & 7 & \infty & \infty & \infty & \infty & \infty & \infty & \infty & 5 & \infty & \infty & \infty & \infty & 18 & 19 & 31 & 10 \\
\infty & 22 & \infty & \infty & \infty & \infty & \infty & \infty & \infty & \infty & 23 & \infty & \infty & \infty & 31 & 24 & 3 & 8 \\
\infty & 19 & \infty & \infty & \infty & \infty & \infty & \infty & \infty & \infty & \infty & 29 & \infty & \infty & 13 & 23 & 28 & 19 \\
\infty & \infty & 18 & \infty & \infty & \infty & 28 & \infty & \infty & \infty & \infty & \infty & 8 & \infty & \infty & 30 & 18 & 0 \\
\infty & \infty & 16 & \infty & \infty & \infty & \infty & 9 & \infty & \infty & 16 & \infty & \infty & \infty & \infty & 11 & 20 & \infty \\
\infty & \infty & 23 & \infty & \infty & \infty & \infty & \infty & 31 & \infty & \infty & 8 & \infty & \infty & \infty & 17 & 15 & 11 \\
\infty & \infty & \infty & 22 & \infty & \infty & \infty & \infty & \infty & 5 & \infty & \infty & 12 & \infty & \infty & 25 & 26 & \infty \\
\infty & \infty & \infty & 16 & \infty & \infty & \infty & \infty & \infty & \infty & 2 & \infty & \infty & 9 & \infty & 7 & 7 & 24 \\
\infty & \infty & \infty & 5 & \infty & \infty & \infty & \infty & \infty & \infty & \infty & 26 & \infty & \infty & 19 & 2 & 26 & \infty \\
\infty & \infty & \infty & \infty & 18 & \infty & 20 & \infty & \infty & \infty & \infty & \infty & 7 & \infty & \infty & 5 & 12 & 4 \\
\infty & \infty & \infty & \infty & 31 & \infty & \infty & 7 & \infty & \infty & 1 & \infty & \infty & \infty & \infty & 19 & 16 & 25 \\
\infty & \infty & \infty & \infty & 0 & \infty & \infty & \infty & 8 & \infty & \infty & 15 & \infty & \infty & \infty & 12 & 27 & 17 \\
\infty & \infty & \infty & \infty & \infty & 7 & \infty & \infty & \infty & 1 & \infty & \infty & 0 & \infty & 21 & \infty & 3 & 21 \\
\infty & \infty & \infty & \infty & \infty & 1 & \infty & \infty & \infty & \infty & 5 & \infty & \infty & 31 & \infty & \infty & 7 & 20 \\
\infty & \infty & \infty & \infty & \infty & 0 & \infty & \infty & \infty & \infty & \infty & 6 & \infty & 25 & \infty & \infty & 31 & 18
\end{pmatrix}$$

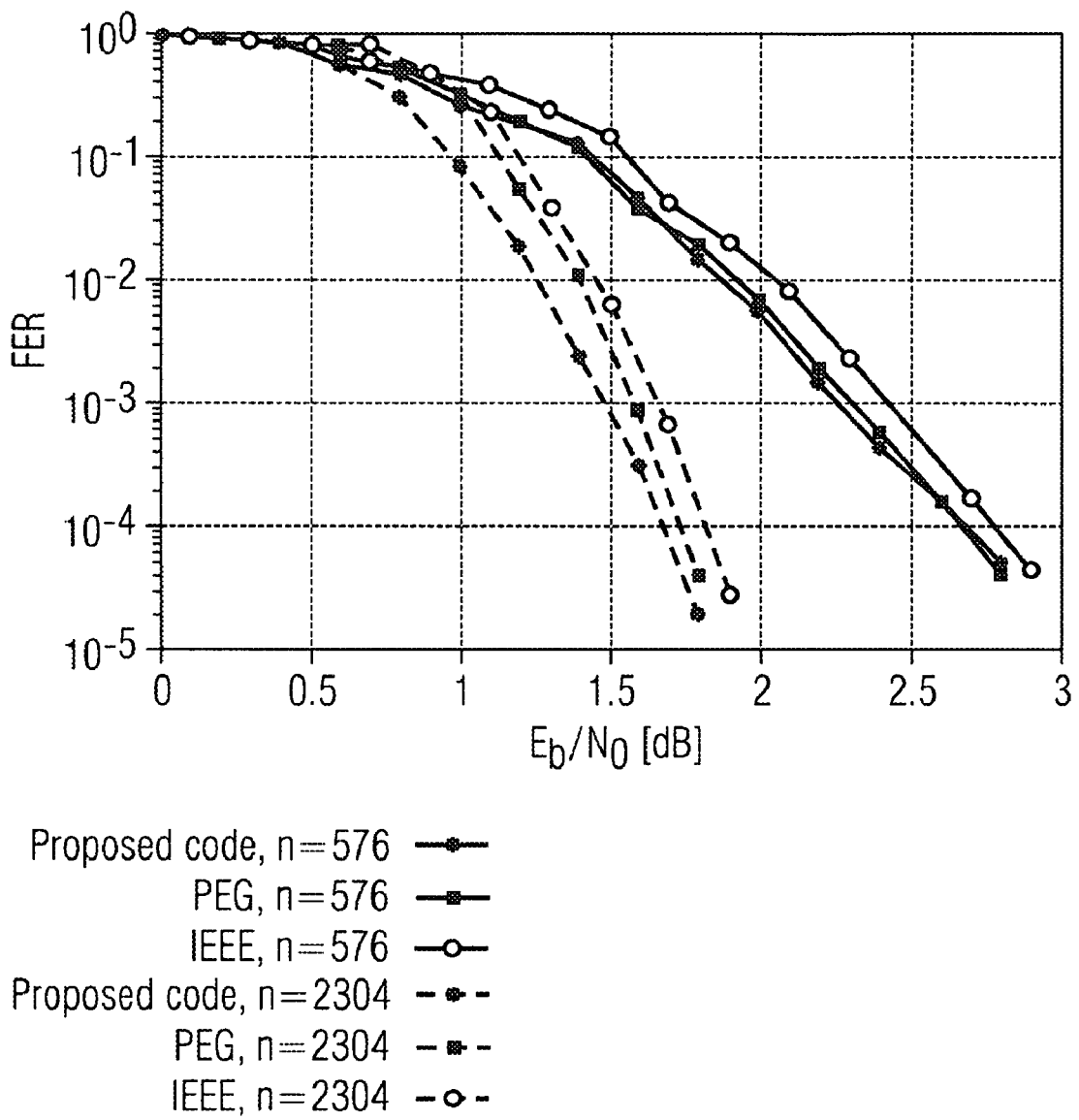

FIG 7

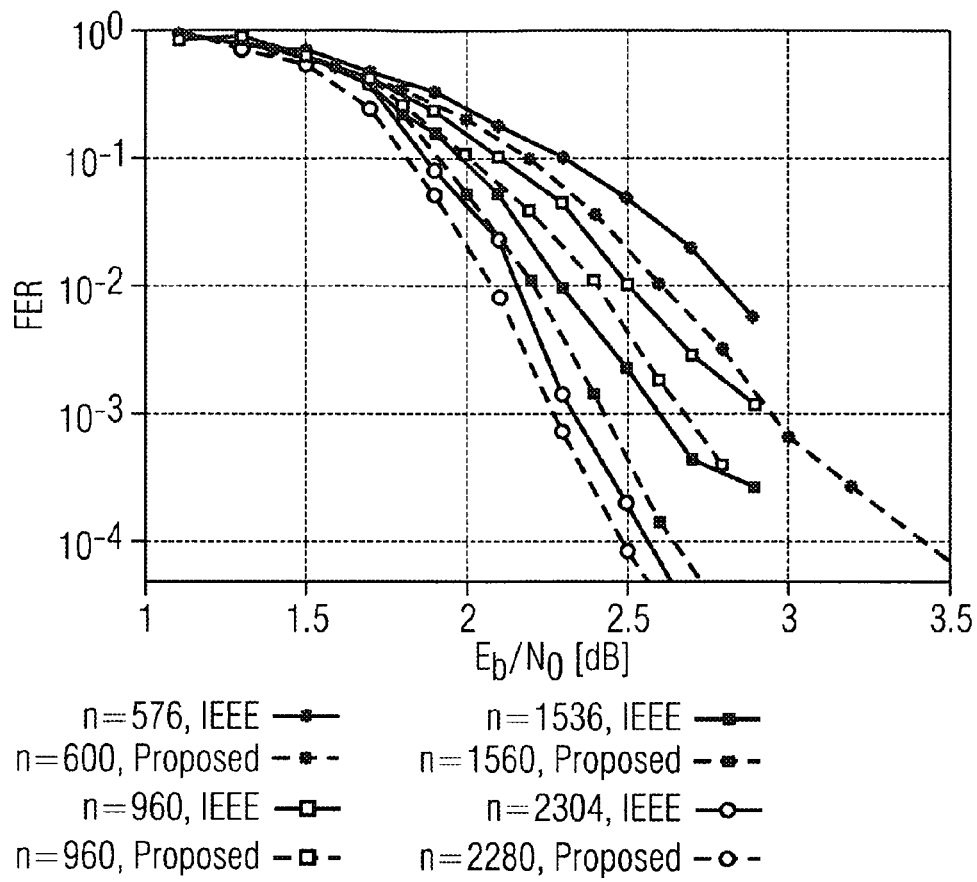

n=576, IEEE
n=600, Proposed
n=960, IEEE
n=960, Proposed
n=1536, IEEE
n=1560, Proposed
n=2304, IEEE
n=2280, Proposed

FIG 8

$$P = \begin{pmatrix} 9 & \infty & \infty & \infty & 16 & \infty & \infty & \infty & 16 & \infty & \infty & \infty & 5 & 0 & 20 & 23 & 16 & 18 & 24 & 18 \\ 6 & \infty & \infty & \infty & \infty & 29 & \infty & \infty & \infty & 14 & \infty & 10 & \infty & 19 & 4 & 25 & 29 & 23 & 16 & 25 \\ 2 & \infty & \infty & 24 & \infty & \infty & 18 & \infty & \infty & \infty & 6 & \infty & \infty & 22 & 3 & 22 & 3 & 4 & 2 & 12 \\ \infty & 27 & \infty & \infty & 24 & \infty & \infty & 16 & \infty & \infty & \infty & \infty & 29 & 13 & 16 & 26 & 18 & 9 & 11 & 28 \\ \infty & 15 & \infty & \infty & \infty & 10 & \infty & \infty & 22 & \infty & \infty & 15 & \infty & 17 & 11 & 4 & 20 & 23 & 12 & 13 \\ \infty & 13 & \infty & 9 & \infty & \infty & 2 & \infty & \infty & \infty & 29 & \infty & \infty & 11 & 13 & 19 & 19 & 4 & 1 & 20 \\ \infty & \infty & 7 & \infty & 11 & \infty & \infty & 20 & \infty & \infty & \infty & \infty & \infty & 6 & 10 & 25 & 24 & 17 & 20 & 23 \\ \infty & \infty & 18 & \infty & \infty & 2 & \infty & \infty & \infty & 23 & \infty & \infty & 5 & 23 & 16 & 24 & 7 & 24 & 16 & 27 \\ \infty & \infty & 1 & 6 & \infty & \infty & 16 & \infty & \infty & \infty & 2 & 20 & \infty & 21 & 8 & 6 & 0 & 10 & 10 & 3 \\ \infty & \infty & \infty & \infty & \infty & \infty & \infty & 5 & 1 & 5 & \infty & \infty & \infty & 0 & 29 & 29 & 26 & 5 & 26 & 14 \end{pmatrix}$$

METHOD FOR ENCODING DATA MESSAGE K' FOR TRANSMISSION FROM SENDING STATION TO RECEIVING STATION AS WELL AS METHOD FOR DECODING, SENDING STATION, RECEIVING STATION AND SOFTWARE

CROSS REFERENCE TO RELATED APPLICATIONS

This application is based on and hereby claims priority to European Application No. 06008954 filed on Apr. 28, 2006, the contents of which are hereby incorporated by reference.

BACKGROUND

Described below is a method for encoding a data message K' for transmission from a sending station to a receiving station as well as a respective method for decoding, a respective sending station, a respective receiving station and respective software.

Construction of good low-density parity-check codes (LDPC codes) became recently one of the hottest research topics in coding theory. In spite of substantial progress in the asymptotical analysis of LDPC codes, as described in T. Richardson et al., "Design of capacity-approaching irregular low-density parity-check codes," *IEEE Transactions On Information Theory*, vol. 47, no. 2, pp. 619-637, February 2001, constructing practical codes of short and moderate length still remains an open problem. The main reason for this is that density evolution analysis requires one to construct irregular LDPC codes, while most of the algebraic code design techniques developed up to now can produce only regular constructions, which inherently lack the capacity approaching behavior. Furthermore, the performance of practical length LDPC codes depends not only on the asymptotic iterative decoding threshold, but also on code minimum distance.

For high-rate codes, minimum distance appears to be the dominant factor. This allows one to solve the code construction problem using traditional techniques of coding theory, like finite geometries, difference sets, etc (see for example Y. Kou et al., "Low-density parity-check codes on finite geometries: A rediscovery and new results," IEEE Transactions on Information Theory, vol. 47, no. 7, November 2001; B. Ammar et al., "Construction of low-density parity-check codes based on balanced incomplete block designs," *IEEE Transactions on Information Theory*, vol. 50, no. 6, June 2004, and S. J. Johnson et al., "Resolvable 2-designs for regular low-density parity-check codes," IEEE Transactions on Communications, vol. 51, no. 9, September 2003). But for lower rate codes (e.g. rate ½) one has to find a trade-off between the minimum distance and iterative decoding threshold. This is typically achieved by performing some kind of conditioned random search, as described in X.-Y. Hu et al., "Regular and irregular progressive edge-growth Tanner graphs," *IEEE Transactions on Information Theory*, vol. 51, no. 1, January 2005; T. Tian et al., "Selective avoidance of cycles in irregular LDPC code construction," *IEEE Transactions On Communications*, vol. 52, no. 8, August 2004; and Hua Xiao et al., "Improved progressive-edge-growth (PEG) construction of irregular LDPC codes," IEEE Communications Letters, vol. 8, no. 12, pp. 715-717, December 2004. Codes obtained with these methods exhibit very good performance, but are very difficult to implement due to absence of any structure. One way to solve this problem is to modify a structured regular parity check matrix so that it becomes irregular, as described in Dale E. Hocevar, "LDPC code construction with flexible hardware implementation," in Proceedings of IEEE International Conference on Communications, May 2003, pp. 2708-2711 and Jingyu Kang et al., "Flexible construction of irregular partitioned permutation LDPC codes with low error floors," IEEE Communications Letters, vol. 9, no. 6, June 2005. However, there is no formalized way to perform such modification, and many trials have to be performed before good code is found.

LDPC codes represent a sub-class of linear codes. Any codeword c of a linear code satisfies the equation $Hc^T=0$, where H is a parity check matrix of the code. On the other hand, for a given data message K the corresponding codeword can be obtained as c=KG, where G is a generator matrix of the code. This implies that the parity check matrix H and the generator matrix G must satisfy the equation $HG^T=0$. For a given parity check matrix H, it is possible to construct many different generator matrices G. It is always possible (probably after applying a column permutation to the check matrix H) to construct a generator matrix in the form G=[A I], where I is the identity matrix, and A is some other matrix. In this case the codeword corresponding to a data message K looks like c=KG=[KA K], i.e. the data message K appears as a sub vector of the codeword. This is known as systematic encoding. The advantage of systematic encoding is that as soon as all channel errors are removed from the codeword, the data message can be immediately extracted from it, without any post-processing. In some cases it is possible to construct other methods for systematic encoding of data messages, more efficient than multiplication by the generator matrix in systematic form. However, the encoding method does not affect the error correction capability of the code.

It is also true that if H is a parity check matrix of some linear code, then product SH is also a parity check matrix for the same code, where S is a non-singular matrix. In particular, if S is a permutation matrix, and H is a low-density matrix, running the belief propagation LDPC decoding algorithm, as described in W. E. Ryan, "An introduction to LDPC codes," in *CRC Handbook for Coding and Signal Processing for Recording Systems*, B. Vasic, Ed. CRC Press, 2004, over SH matrix would give exactly the same results as for the case of the original H matrix.

Many LDPC code constructions are based on expansion of a template matrix P by substituting given entries $p_{ij}$ with p×p permutation matrices, where p is the expansion factor. Using the construction according to FIGS. 2 to 8, codes with different length but the same rate can be generated starting from a single template matrix. More specifically, their parity check matrix is given by two sub-matrices, the first one, $H_z$, is a double diagonal matrix implementing the so-called zigzag pattern, and the second one, $H_i$, is constructed based on the expansion of a template matrix, i.e. by substituting its entries with permutation and zero matrices. By changing the expansion factor, codes of different lengths are obtained. Obviously, this requires employing different permutation matrices. Despite of the simplicity of this operation, changing the expansion factor, requires a re-routing of the edges in the Tanner Graph corresponding to the parity check matrix. Since the Tanner Graph structure is implemented for the so called "message passing" or "belief propagation" decoding at the receiver, a change in its structure can afford significant hardware complexity when considering the whole code family.

A possibility to obtain longer codes from shorter codes is by using concatenated coding, as described in the B. Ammar et al. article cited above. However, this usually changes also the code rate. Furthermore, LDPC codes are known to perform not so well if employed in concatenated code constructions. The reason is that it is extremely difficult to obtain a good node degree distribution in the Tanner graph of the concatenated code.

SUMMARY

An aspect is to provide an improved method for encoding a data message using a code the length of which can be chosen such that the above mentioned disadvantages in respect of decoder structure and code rate are overcome. It is a aspect to provide a respective method for decoding, a respective sending station and a respective receiving station as well as respective software.

According to the method for encoding a data message K' for transmission from a sending station to a receiving station, the encoding generates a codeword c' of length $n=w*n_0$, whereas w and no are integer numbers, and generating the codeword c' is achieved by and/or mathematically writable as multiplication of the data message K' with a generator matrix G', c'=K'G', whereas the generator matrix G' is a solution of a matrix equation $H'G'^T=0$, with $H'=[H_z' \; H_i']$, where $H_z'$ is a $w*m_0 \times w*m_0$ matrix with two adjacent diagonals of 1's having 0 in all other positions and $H_i'$ is a $w*m_0 \times w*(n_0-m_0)$ matrix, and $H_i'$ is a matrix obtained by interleaving rows of a block-diagonal matrix $H_i'^{(w)}$ having w matrices $H_i$ of dimension $m_0 \times (n_0-m_0)$ in the diagonal and 0 in all other positions, and whereas $H_i$ is further chosen such that $H=[H_z \; H_i]$ is a parity check matrix of a code with length $n_0$, where $H_z$ is a $m_0 \times m_0$ matrix with two adjacent diagonals of 1's having 0 in all other positions.

The method enables creation of codes with w times the length of a prototype code with length $n_0$ without changing the respective Tanner graph structure. Therefore the decoder structure, e.g. hardware components, used for the prototype code of length $n_0$ can also be used for decoding codewords encoded according to the method.

In addition to interleaving rows, it is also possible to interleave the columns of matrix H'. The resulting code is equivalent and has the same performance as the code generated without interleaving columns.

Advantageously $H_i$ is further chosen such that encoding of a data message K using a generator matrix G generates a codeword c of length n0, c=KG, whereas the generator matrix G is a solution of a matrix equation $HG^T=0$, with $H=[Hz \; Hi]$, where Hz is a $m0 \times m0$ matrix with two adjacent diagonals of 1's having 0 in all other positions.

Advantageously $H_i$ is obtained by interleaving rows of a first matrix $H_u$, which is a block matrix consisting of permutation matrices and zero matrices.

This means that the parity check matrix H of the respective code is given by $H=[H_z \; SH_u]=S[S^{-1}H_z \; H_u]$, where S is a permutation matrix used for interleaving rows of the first matrix $H_u$. Since permuting rows of the parity check matrix does not change the code, one can use also a parity check matrix in the form $[S^{-1}H_z \; H_u]$.

Advantageously a generator matrix G' is used, which satisfies the condition $G'=[((H_z')^{-1} \; H_i')^T I]$.

Therefore, if the codeword c' is mathematically written as $c'=[c_z' \; c_i']$, the multiplication of the data message K' and this generator matrix G' results in $c_i'$ being the data message K', while $c_z'$ is given by $c_z'^T=(H_z')^{-1}H_i'K'^T$. Multiplication by the sub matrix $(H_z')^{-1}H_i'$ can be implemented either straightforwardly, or as a sequence of the following transformations. Since $H_i'=S'H_i'^{(w)}$, where S' is the permutation matrix used for interleaving rows of the block-diagonal matrix $H_i'^{(w)}$, one can either multiply the vector $K'^T$ (the data message) directly by $H_i'$, or multiply it first by $H_i'^{(w)}$, and then interleave elements of the obtained vector. Multiplication of a vector by matrix $H_z'^{-1}$ may be implemented by using a filter with the transfer function $1/(1+D')$.

Advantageously a rectangular interleaver is used for interleaving rows of the block-diagonal matrix $H_i'^{(w)}$, that is by using the permutation $\Pi(i)=(i \bmod m_0)w+\lfloor i/m_0 \rfloor$, $i=0 \ldots wm_0-1$.

Advantageously the first matrix $H_u$ is generated by expansion of a template matrix P of dimension $s \times t$, the expansion being made by replacing all elements $p_{ij}$ of the template matrix P which satisfy the condition $0 \le p_{ij} < \infty$ with cyclic permutation matrices of dimension $p \times p$, having a value 1 at positions $(r,(p_{ij}+r) \bmod p)$, with $r=0 \ldots p-1$, $i=0 \ldots s-1$ and $j=0 \ldots t-1$, and replacing all other element of P which satisfy the condition $p_{ij}=\infty$ or $p_{ij}<0$ with $p \times p$ zero matrices.

By changing the expansion factor p different values for $n_0$ can be chosen because changing p changes the size of $H_i$ and $H_z$, i.e. $n_0$ and $m_0$.

Advantageously a rectangular interleaver is used for interleaving rows of the first matrix $H_u$, that is by using the permutation $\Pi(i)=(i \bmod p)s+\lfloor i/p \rfloor$, $i=0 \ldots sp-1$.

The method for decoding a data message K' from a codeword c' received from a sending station shows all necessary steps to decode the codeword c' and uses a parity check matrix H' which is build according to the method for encoding. According to the method for encoding, the parity check matrix H' is used in an equation $H'G'^T=0$ which has to be satisfied by a generator matrix G' that is usable for mathematically expressing encoding of the data message K'.

The sending station includes an encoding unit to encode a data message K' into a codeword c' of length $n=w*n_0$, whereas w and $n_0$ are integer numbers, and generating the codeword c' is achieved by and/or mathematically writable as multiplication of the data message K with a generator matrix G', c'=K'G', whereas the generator matrix G' is a solution of a matrix equation $H'G'^T=0$, with $H'=[H_z' \; H_i']$, where $H_z'$ is a $w*m_0 \times w*m_0$ matrix with two adjacent diagonals of 1's having 0 in all other positions and $H_i'$ is a $w*m_0 \times w*(n_0-m_0)$ matrix, and $H_i'$ is a matrix obtained by interleaving rows of a block-diagonal matrix $H_i'^{(w)}$ having w matrices $H_i$ of dimension $m_0 \times (n_0-m_0)$ in the diagonal and 0 in all other positions, and whereas $H_i$ is further chosen such that $H=[H_z \; H_i]$ is a parity check matrix of a code with length $n_0$, where $H_z$ is a $m_0 \times m_0$ matrix with two adjacent diagonals of 1's having 0 in all other positions.

The receiving station includes at least one unit decoding a codeword c' received from a sending station using a parity check matrix H', build according to the method for encoding, for checking parity of codeword c'.

The software for encoding a data message K' includes program code which outputs a codeword c' from an input data message K', if the software is running on a computer, by use of the method for encoding.

Further, the software for decoding a codeword c' includes program code which outputs a data message K' from an input codeword c' and uses a parity check matrix H' build according to the method for encoding, if the software is running on a computer.

BRIEF DESCRIPTION OF THE DRAWINGS

These and other aspects and advantages will become more apparent and more readily appreciated from the following description of exemplary embodiments, taken in conjunction with the accompanying drawings of which:

FIG. 5 is a template matrix P for rate ½ codes,

FIG. 6 is a graph illustrating performance of rate ½ codes

FIG. 7 is a graph illustrating performance of rate ⅔ codes

FIG. 8 is a template matrix P for rate ⅔ codes

DETAILED DESCRIPTION OF THE PREFERRED EMBODIMENT

Figure 1:
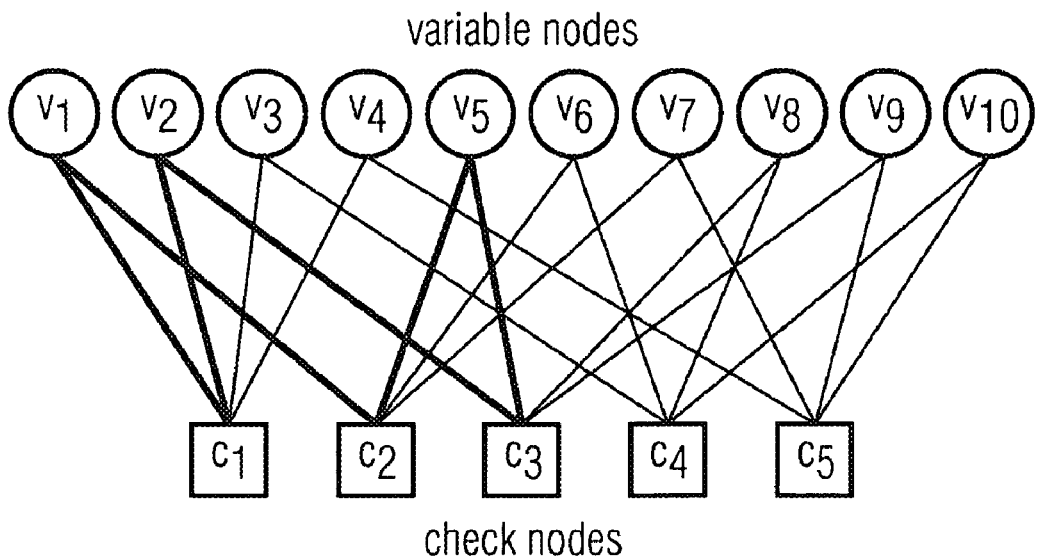
FIG. 1 is a Tanner graph of an example code (state of the art)

Reference will now be made in detail to the preferred embodiments, examples of which are illustrated in the accompanying drawings, wherein like reference numerals refer to like elements throughout.

A sending station is for example a terminal or a base station of a radio communications system.

A receiving station is for example a terminal or a base station of a radio communications system.

A terminal is for instance a mobile radio terminal, particularly a mobile phone or a flexible of fixed device, for transmission of picture data and/or sound data, for fax, short message service (SMS) messages and/or E-mail messages, and/or for internet access.

The method can advantageously be used in any kind of communications system. A communications system is for example a computer network or a radio communications system.

Radio communications systems are systems in which a data transmission between terminals is performed over an air interface. The data transmission can be both bidirectional and unidirectional. Radio communications systems are particularly cellular radio communication systems, e.g. according to the GSM (Global System for Mobile Communications) standard or the UMTS (Universal Mobile Telecommunication System) standard. Also future mobile radio communications systems, e.g. according to the fourth generation, as well as ad-hoc-networks shall be understood as radio communication systems. Radio communication systems are also wireless local area networks (WLAN) according to standards from the Institute of Electrical and Electronics Engineers (IEEE) like 802.11a-i, HiperLAN1 and HiperLAN2 (High Performance Radio Local Area Network) as well as Bluetooth-Networks.

An Overview of LDPC Codes

LDPC codes are defined as a class of linear binary codes having a sparse $m_0 \times n_0$ parity check matrix H. The dimension of the code is given by $k \geq n_0 - m_0$. Alternatively, the LDPC code can be characterized by a bi-partite graph (Tanner graph) with $n_0$ variable nodes and $m_0$ check nodes, as described in the W: E. Ryan article. An edge connects variable node j with check node i if and only if $H_{ij}=1$. For example, consider the following parity check matrix:

$$H = \begin{pmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{pmatrix}.$$

FIG. 1 presents the associated Tanner graph.

The degree of a node in the graph is the number of edges connected to this node. If different nodes in the Tanner graph have different degree, the code is called irregular. Otherwise, the code is the to be regular. The Tanner graph is characterized by its variable and check node degree distributions $$\lambda(x) = \sum_i \lambda_i x^{i-1}$$

and $$\rho(x) = \sum_i \rho_i x^{i-1},$$

where $\lambda_i$ and $\rho_i$ are the fractions of edges connected to degree-i variable and check nodes, respectively. These edge perspective distributions can be translated into the node perspective distributions $$\Lambda(x) = \sum_i \Lambda_i x^{i-1}$$

and $$R(x) = \sum_i R_i x^{i-1},$$

where $\Lambda_i$ and $R_i$ are the fractions of variable and check nodes of degree i. Graph-based description of LDPC code allows one to design an iterative message-passing decoding algorithm, as described in the W. E. Ryan article. This algorithm was analyzed in S.-Y. Chung et al., "On the design of low-density parity-check codes within 0.0045 dB of the Shannon limit," *IEEE Communications Letters*, vol. 5, no. 2, February 2001 for the case of infinitely long codes and binary-input memoryless output-symmetric channels. It was shown that for a given ensemble of LDPC codes there exists a value of the channel parameter (e.g. signal-to-noise ratio), so that the iterative decoding is successful for all parameter values greater than this threshold. It is possible to design a numeric algorithm for computing the threshold for given node degree distributions, and even perform their optimization in order to minimize it, as described in the S.-Y. Chung et al. article.

For finite-length LDPC codes, the performance depends not only on the asymptotic iterative decoding threshold, but also on the loop structure of the code. The girth of a Tanner graph is the minimum cycle length of the graph. The girth of the graph on FIG. 1 is 6, since there is a length-6 loop $v_1$-$c_1$-$v_2$-$c_3$-$v_5$-$c_2$-$v_1$ connecting its vertices. Short (especially, length 4) cycles are known to have negative impact on the performance of the message-passing decoding algorithm, so such Tanner graphs should be, in general, avoided. However, in the T. Tian et al. article cited above, it was shown that not all short loops are equally harmful. If the nodes in a loop are connected to the nodes not participating in this loop, the extrinsic information can still flow over the Tanner graph, and the decoding can proceed. It is possible to introduce the approximate cycle extrinsic message degree (ACE) of a loop as described in the T. Tian et al. article cited above $$ACE = \sum_i (d_i - 2),\qquad(1)$$

where summation is performed over all variable nodes in the loop, and $d_i$ is the degree of the i-th variable node. One can impose a constraint $ACE_{min} > \eta$ on minimum ACE value over all loops of length $1 \leq 2l_{ACE}$ in a Tanner graph being constructed. In A. Ramamoorthy and R. Wesel, "Analysis of an algorithm for irregular LDPC code construction," in *Proceedings of IEEE International Symposium on Information Theory*, 2004, p. 69, it was shown that in this case the number of stopping sets (i.e. erasure configurations unrecoverable by the message-passing algorithm) of size$\leq l_{ACE}$ decreases exponentially with $\eta$. Since positions of non-zero symbols of any codeword also constitute a stopping set, ACE conditioning improves also code minimum distance (and, in general, weight spectrum).

Figure 2:
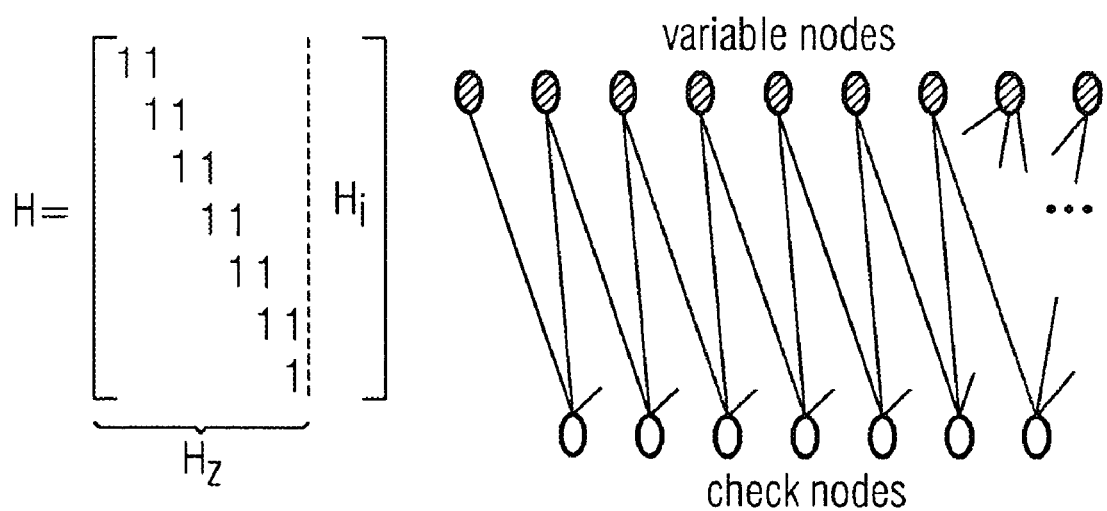
FIG. 2 is a parity check matrix and Tanner graph with a zigzag pattern.

Equation (1) implies that ACE of a loop involving only degree-2 nodes is equal to zero. Furthermore, it is known that any loop of length 2l in a degree-2 part of the Tanner graph corresponds to a weight-l codeword. Since optimized node degree distributions usually have $1 > \Lambda_2 >> 0$ (i.e. there should be substantial amount of degree-2 nodes), it is especially important to maximize the length of loops passing through the degree-2 part of the Tanner graph. This can be achieved by arranging as many as possible degree-2 nodes into the zigzag pattern shown on FIG. 2. If needed, the remaining degree-2 nodes may be packed into the part $H_i$. Zigzag pattern does also not need to involve all check nodes. This implies that the zigzag pattern is a very good starting point in the design of a LDPC code.

Observe, that systematic encoding of a data message K with such a code can be performed by multiplying K with a generator matrix $G = [(H_z^{-1} H_i)^T I]$ Description of Embodiments Showing a Possible Construction of LDPC Codes The matrix $H_i$ should be constructed under the following constraints:
1. the Tanner graph of the obtained parity check matrix $H=[H_z \; H_i]$ should have the node degree distribution approximately equal to the target one;
2. low-weight codewords should be avoided;
3. more generally, small stopping sets in H should be avoided, i.e. the constraint $ACE \geq \eta$ for some $\eta$ should be satisfied;
4. length-4 loops should be avoided;
5. $H_i$ should be structured.

These guidelines are implemented in an algorithm for constructing $H_i$.

We propose to construct $H_i$ in two steps. First, let us expand a s×t template matrix P, i.e. replace its elements $p_{ij}$: $0 \leq p_{ij} < \infty$ with p×p cyclic permutation matrices having 1's in positions $(r, (p_{ij}+r) \bmod p), r=0\ldots p-1, i=0\ldots s-1, j=0\ldots t-1$. All other elements of P are replaced with p×p zero matrices. A first matrix $H_u$ is obtained by expanding the template matrix P. Second, let us permute (interleave) the rows of the first matrix $H_u$. This leads to a sp×tp matrix $H_i$. One possible row permutation is given by a rectangular interleaver: $\Pi(i)=(i \bmod p)s + \lfloor i/p \rfloor, i=0\ldots sp-1$. Here s, p and t are the parameters of the construction. Appending $m_0$ zigzag columns to $H_i$, one obtains the $m_0 \times n_0$ parity check matrix H with $m_0=sp$, $n_0=tp+m_0$. The template matrix P is the result of an optimization process described below, using a prototype matrix M, having 1's in positions (i,j): $0 \leq p_{ij} < \infty$, and 0 elsewhere.

Observe that $H_i$ can be specified with at most $\overline{M}$ integers $p_{ij}$, where $\overline{M}$ is the number of 1's in the prototype matrix M.

Figure 3:
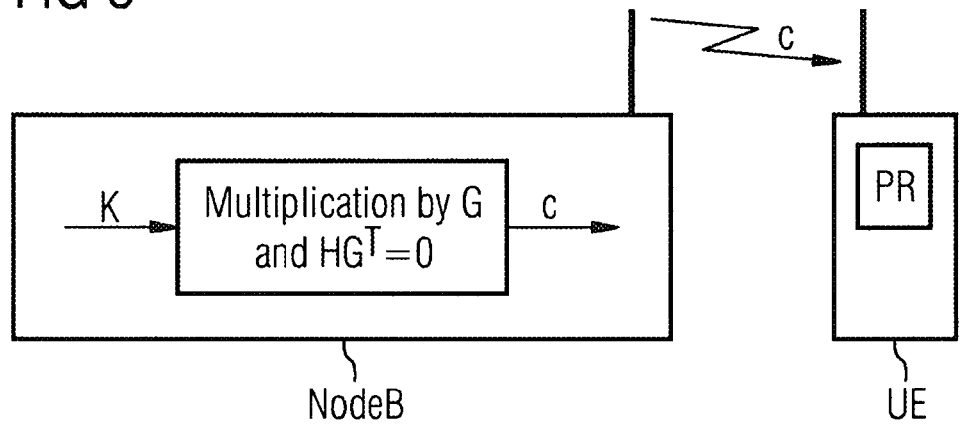
FIG. 3 is a block diagram of a first embodiment of an encoder.
Figure 4:
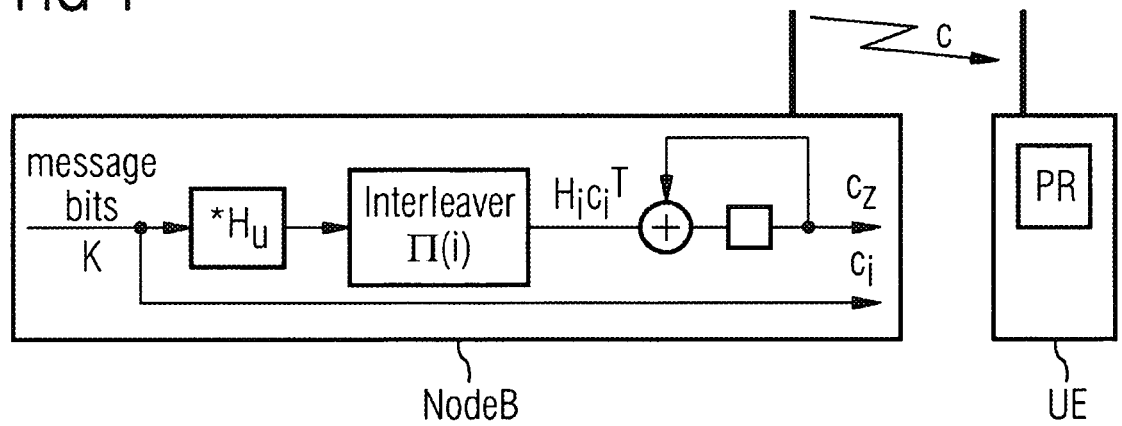
FIG. 4 is a block diagram of a second embodiment of an encoder.

FIGS. 3 and 4 illustrate embodiments of an encoder for the described code, used for encoding a data message K into a codeword c. The data message K is e.g. a vector of k Bits which has to be transmitted from a sending station NodeB to a receiving station UE. The receiving station UE has a processor PR to decode the codeword c, whereas decoding includes using the parity check matrix H to run the belief propagation decoding algorithm and parity check the codeword c.

In FIG. 3 the codeword c, which can mathematically be written as c=[cz ci], is generated by multiplying the data message K by a generator matrix G, which must satisfy the equation $HG^T=0$. The parity check matrix is build as described in the very last paragraph.

In FIG. 4 an even more efficient approach is presented by using a generator matrix G which satisfies the condition $G=[(H_z^{-1}H_i)^T I]$. Therefore, if the codeword c is mathematically written as $c=[c_z \; c_i]$, the multiplication of the data message K and this generator matrix G results in the first component $c_i$ being the data message K, while the second component $c_z$ is given by $c_z^T = H_z^{-1} H_i K^T$. I.e. the second component $c_z$ of the codeword c is calculated using row permutation by multiplying the data message K with the first matrix $H_u$ and by permuting the rows of the result of this multiplication and by filtering the result. Alternatively, the row permutation can by applied to the first matrix $H_u$ before multiplication with the data message K. The parity check matrix H, i.e. the matrices $H_i$ and $H_z$ are build in the same way as described for FIG. 3.

The prototype matrix M can be constructed by different methods, e.g. manually, or using the PEG algorithm, as described in the X.-Y Hu et al. article cited above, so that it satisfies approximately the given node degree distribution pair $(\Lambda(x), R(x))$. Particular values of $p_{ij}$ integers in the template matrix P should be selected so that the obtained parity check matrix H satisfies the requirements 1-5 presented above. The following section presents a randomized algorithm for computing them.

Optimization Algorithm

The idea of the optimization algorithm presented below is that low-weight input words after multiplication by the first matrix $H_u$, the interleaver, and 1/(1+D) filter as shown in FIG. 4, should not transform into low-weight vectors $(c_z, c_i)$. This is very similar to the problem of constructing interleavers for turbo codes.

The structure of the zigzag pattern allows one to calculate the weight of the $y = H_z^{-1} x$ vector as $$S(x) = \begin{cases} \sum_{j=0}^{\lceil l/2 \rceil - 1} (x_{l-2j} - x_{l-2j-1}), & \text{if } x_l < z \\ \infty, & \text{otherwise} \end{cases} \qquad (1)$$

$$S(x) = \begin{cases} \sum_{j=0}^{\lceil l/2 \rceil - 1} (x_{l-2j} - x_{l-2j-1}), & \text{if } x_l < z \\ \infty, & \text{otherwise} \end{cases} \qquad (1)$$

In principle, this allows one to consider all possible input patterns, compute for a given $p_{ij}$ set the input vector $x = H_i c_i^T$ of the 1/(1+D) filter, find the weight of the filter output, and deduce the minimum distance $d_{min}$ of the code obtained. Then one can perform maximization of $d_{min}$ over all possible $p_{ij}$ values. However, this approach is quite impractical due to exponential number of input patterns, and huge size of the search space. Therefore one has to limit the search scope to data messages K of k Bits having sufficiently small weight wt(K)≦α. Furthermore, the optimization of $p_{ij}$ values can be performed on the column-by-column basis using a variation of a genetic algorithm:

6. Construct a prototype matrix M with the required column and row degree distribution.
7. Let j:=0.
8. Generate $p_{ij}$ randomly for all i s.t. $M_{ij}$=1.
9. Make sure that the matrix $\hat{H}_i$ obtained by expanding first j+1 columns of the template matrix P and by permuting rows of the expanded matrix appropriately, does not have length-4 loops and its minimal ACE is not less than a given threshold η. This can be implemented efficiently using the algorithms presented in Marc P. C. Fossorier, "Quasi-cyclic low-density parity check codes from circulant permutation matrices," *IEEE Transactions On Information Theory*, vol. 50, no. 8, August 2004, and the T. Tian et al. article cited above. Go to step 3 in case of failure.
10. Consider all possible input patterns K∈GF(2)$^{(j+1)p}$:wt(K) ≦α. Determine the weights of the associated output vectors of the zigzag encoder using (1), and find the minimal codeword weight, which is denoted here by $S_{min}$.
11. Repeat steps 3-5 a given number of times, and select $p_{ij}$ values maximizing $S_{min}$. Let $\hat{d}_j$ be the maximal value of $S_{min}$.
12. Let j:=j+1.
13. if j<t, go to step 1.

Observe that $\hat{d}=\min_j \hat{d}_j$ gives an upper bound on the minimum distance of the code obtained. Clearly, increasing α, the weight of input vectors being analyzed, improves the accuracy of this estimate. In practice, for well-chosen prototype matrices M, it is sufficient to set α≈5 to obtain $\hat{d}$ very close to the true minimum distance of the code.

The algorithm presented above optimizes the template matrix P for a fixed value of the expansion factor p. However, it is possible to consider simultaneously a number of different expansion factors, maximizing at step 6 the weighted sum of estimated minimum distances of the codes obtained for the same template matrix P, but different expansion factors p. As a consequence, a unique template matrix P for parity check matrices for a number of different code lengths, but the same rate, is obtained.

The proposed algorithm generalizes the methods presented in the Dale E. Hocevar article, the Jingyu Kang et al. article and Rich Echard et al., "Design considerations leading to the development of good □-rotation LDPC codes," IEEE Communications Letters, vol. 9, no. 5, May 2005 in several ways. First, interleaving of rows of the first matrix $H_u$ can be considered as an additional degree of freedom in optimization of the LDPC code. The optimization algorithm presented above does not depend on it explicitly. Second, there are no artificial restrictions on $p_{ij}$ values coming from the original algebraic LDPC constructions (cf. the Dale E. Hocevar and R. M. Tanner, Deepak Sridhara, Arvind Sridharan, Thomas E. Fuja, and Daniel J. Costello, "LDPC block and convolutional codes based on circulant matrices," *IEEE Transactions on Information Theory*, vol. 50, no. 12, December 2004). The price for this is absence of an explicit algorithm for computing $p_{ij}$. But since the number of these values is quite small compared to the size of the template matrix P (see FIGS. 5 and 8), this is not a serious drawback. Third, the process of finding good codes is formalized, and the number of trial-and-error attempts is reduced. Provided that sufficient computational power is available, the proposed algorithm can produce reliable estimates of the minimum distance of the code obtained, providing thus valuable feedback to the code designer.

Numeric Results

The template matrix P in FIG. 5 can be used for construction of rate ½ codes to be used e.g. in the embodiments according to FIG. 3 or 4. Each integer entry $p_{ij}$ should be replaced with a p×p cyclic permutation matrix given by $p_{ij}$, while ∞ entries should be replaced with p×p zero matrices. $m_0$=s*p zigzag columns should be added to it after expanding it and permuting the rows.

The row permutation used is (rectangular interleaver) Π(i)=(i mod p)s+⌊i/p⌋, i=0 . . . sp−1. FIG. 6 presents simulation results illustrating the performance of the obtained codes in AWGN channel, as well as the performance of PEG and IEEE 802.16 codes with similar parameters (see B. Classon et al, "LDPC coding for OFDMA PHY," Tech. Rep. C802.16e-05/066r3, IEEE 802.16 Broadband Wireless Access Working Group, 2005).

It can be seen that the proposed code outperforms IEEE codes, and in some cases even fully random PEG codes, which are currently considered to be the best ones from the point of view of performance.

FIG. 7 illustrates the performance of rate ⅔ codes, and FIG. 8 presents a compact representation of the corresponding template matrix P. The row permutation used is (rectangular interleaver) Π(i)=(i mod p)s+⌊i/p⌋, i=0 . . . sp−1. It can be seen that the proposed code considerably outperforms the IEEE one.

A method for constructing structured irregular LDPC codes was presented. The code construction is based on a block-permutation matrix with additional row permutation. The parameters of the permutation matrix are filled by an optimization algorithm, which attempts to maximize the code minimum distance. The numeric results indicate that the codes obtained with this method have excellent minimum distance and no visible error floor.

The proposed construction allows many generalizations and improvements. For example, it is possible to replace the cyclic permutation matrices with some other parametric permutations, e.g. based on permutation polynomials. Second, additional LDPC performance criteria can be integrated into the optimization algorithm.

Construction of Codes with Different Lengths

It was determined that starting from a parity check matrix H=[$H_z$ $H_i$] of a code with length $n_0$, whereas $H_z$ is a $m_0 \times m_0$ matrix with two adjacent diagonals of 1's having 0 in all other positions and $H_i$ is a $m_0 \times (n_0-m_0)$ matrix, codes with length w*$n_0$ can be constructed by using a parity check matrix H'= [$H_z$' $H_i$'], if $H_z$' is chosen as w*$m_0$×w*$m_0$ matrix with two adjacent diagonals of 1's having 0 in all other positions and $H_i$' is a w*$m_0$×w*($n_0-m_0$) matrix obtained by interleaving rows of a block-diagonal matrix $H_i'^{(w)}$ having w matrices $H_i$ of dimension $m_0 \times (n_0-m_0)$ in the diagonal and 0 in all other positions.

The matrix H, in particular $H_i$, can for example be constructed as described above in respect of FIGS. 2 to 8. Certainly also other constructions of H can be used.

If for example w=2, $H_i'^{(2)}$ is given by:

$$H_i'^{(2)} = \begin{pmatrix} H_i & 0 \\ 0 & H_i \end{pmatrix}$$

And H' is in this case given by H'=[$H_z$'Π$H_i'^{(2)}$], e.g. with the permutation Π(i)=(i mod $m_0$)2+⌊i/$m_0$⌋, i=0 . . . 2$m_0$−1.

A codeword c', which can mathematically be written as c'=[$c_z$' $c_i$'], is generated by multiplying a data message K' by a generator matrix G', which must satisfy the equation H'G'$^T$=0.

Observe, that systematic encoding of the data message K' can be performed by multiplying K' with the generator matrix G' fulfilling the equation G'=[(($H_z$')$^{-1}$$H_i$')$^T$I].

The encoding and decoding for generating the codeword c' with length $w*n_0$ is equivalently performed as described in connection with FIGS. 3 and 4 using H' and G' instead of H and G.

Figure 9:
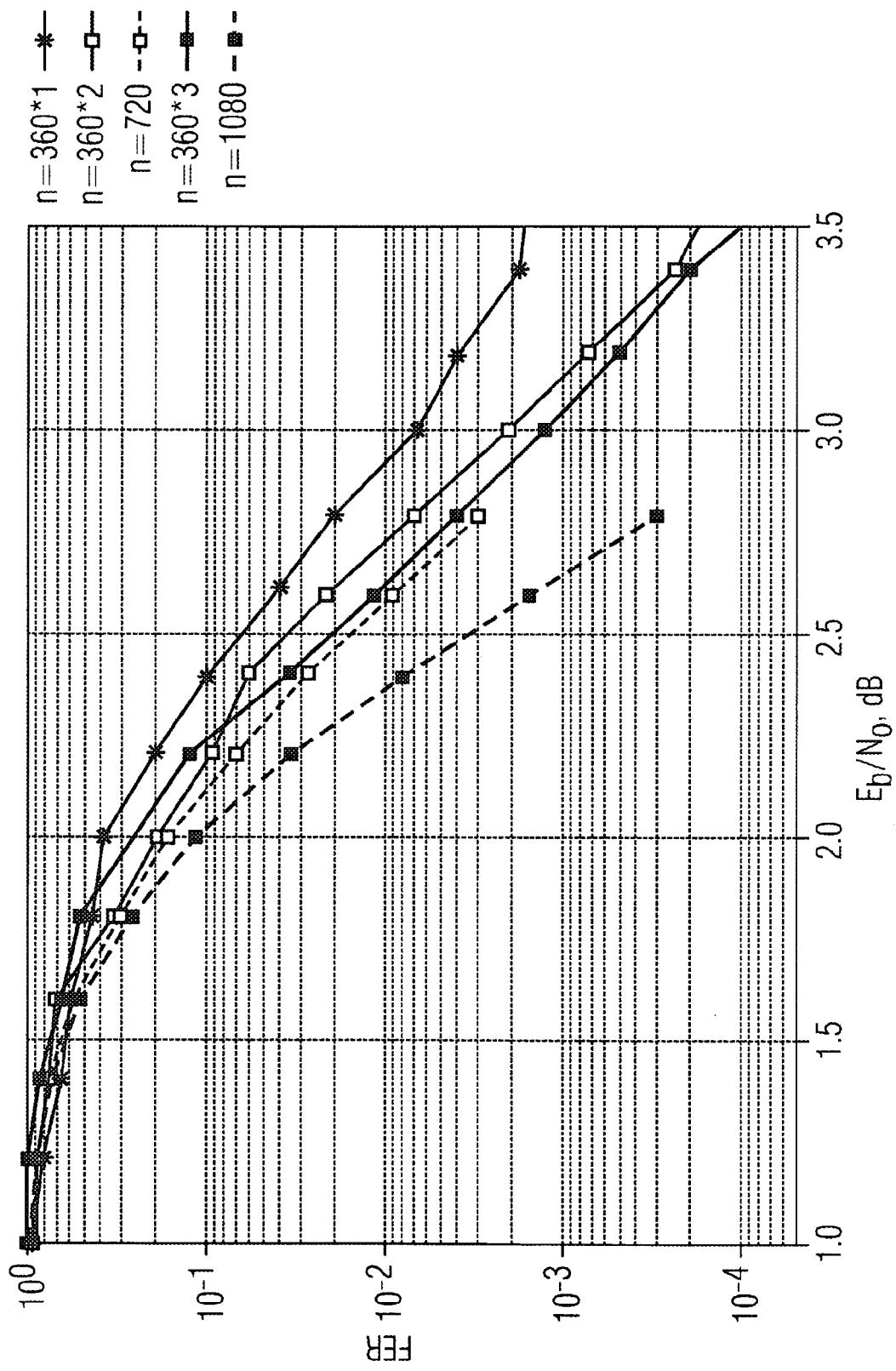
FIG. 9 is a graph illustrating performance of rate ⅔ codes with lengths w*360, w=1, 2, 3, build according to the method of encoding and rate ⅔ codes with lengths 720 and 1080 build using different expansion factors p.

By way of example, the performance (FER: Frame Error Rate as a function of signal-to-noise ratio $E_b/N_0$) of rate ⅔ codes constructed according to the method and having lengths of w*360, w=1, 2, 3 and the performance of codes of the same lengths constructed using different expansion factors p is shown in FIG. 9. The performance of the codes is only slightly worse than the performance of codes using respective expansion factors p. But the advantage is that a decoder structure, which can be used for the code with length 360 and which is usually realized by respective hardware components, can be maintained for codes with length w*360, whereas the decoder structure changes for codes of the same length constructed by choosing an appropriate expansion factor p.

The method for obtaining longer LDPC codes can be based on other zigzag-based constructions as well, see for example the Rich Echard et al. article.

The system also includes permanent or removable storage, such as magnetic and optical discs, RAM, ROM, etc. on which the process and data structures of the present invention can be stored and distributed. The processes can also be distributed via, for example, downloading over a network such as the Internet. The system can output the results to a display device, printer, readily accessible memory or another computer on a network.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A method for encoding a data message K' for transmission from a sending station to a receiving station, comprising:
   obtaining a matrix $H_i$', where $H_i$' is a $w*m_0 \times w*(n_0-m_0)$ matrix, by interleaving rows of a block-diagonal matrix $H_i$'$^{(w)}$ having w matrices $H_i$ of dimension $m_0 \times (n_0-m_0)$ in the diagonal and 0 in all other positions, where w and $n_0$ are integer numbers, H=[$H_z$ $H_i$] is a parity check matrix of a code with length $n_0$, and $H_z$ is a $m_0 \times m_0$ matrix with two adjacent diagonals of 1's having 0 in all other positions; and
   generating a codeword c' of length $n=w*n_0$ by and/or mathematically writable as multiplication of the data message K' with a generator matrix G', c'=K'G', where the generator matrix G' is a solution of a matrix equation H'G'$^T$=0, with H'=[$H_z$' $H_i$'], and $H_z$' is a $w*m_0 \times w*m_0$ matrix with two adjacent diagonals of 1's having 0 in all other positions.

2. The method according to claim 1, further comprising encoding a data message K using a generator matrix G to generate a codeword c of length $n_0$, c=KG, where the generator matrix G is a solution of a matrix equation HG$^T$=0, with H=[$H_z$ $H_i$] and $H_z$ is a $m_0 \times m_0$ matrix with two adjacent diagonals of 1's having 0 in all other positions.

3. The method according to claim 2, further comprising obtaining $H_i$ by interleaving rows of a first matrix $H_u$, which is a block matrix consisting of permutation matrices and zero matrices.

4. The method according to claim 3, wherein the generator matrix G' is given by G'=[(($H_z$')$^{-1}$ $H_i$')$^T$I].

5. The method according to claim 4, wherein a rectangular interleaver is used for interleaving rows of the block-diagonal matrix $H_i$'$^{(w)}$, that is by using the permutation $\Pi(i)=(i \bmod m_0)w+\lfloor i/m_0 \rfloor, i=0 \ldots wm_0-1$.

6. The method according to claim 5, further comprising generating the first matrix $H_u$ by expansion of a template matrix P of dimension s×t, the expansion made by replacing all elements $p_{ij}$ of the template matrix P which satisfy the condition $0 \leq p_{ij} < \infty$ with cyclic permutation matrices of dimension p×p, having a value 1 at positions $(r,(p_{ij}+r) \bmod p)$, with r=0 ... p−1, i=0 ... s−1 and j=0 ... t−1, and replacing all other elements $p_{ij}$ which satisfy the condition $p_{ij}=\infty$ or $p_{ij}<0$ with p×p zero matrices, where $p_{ij}$ are some integers.

7. The method according to claim 6, wherein a rectangular interleaver is used for interleaving rows of the first matrix $H_u$, that is by using the permutation $$\prod(i) = (i \bmod p)s + \left\lfloor \frac{i}{p} \right\rfloor, i = 0 \ \ldots \ sp-1.$$

8. A sending station, comprising;
   an encoding unit encoding a data message K' into a codeword c' of length $n=w*n_0$, where w and $n_0$ are integer numbers, and generating the codeword c' is achieved by and/or mathematically writable as multiplication of the data message K' with a generator matrix G', c'=K'G', and the generator matrix G' is a solution of a matrix equation H'G'$^T$=0, with H'=[$H_z$' $H_i$'], where $H_z$' is a $w*m_0 \times w*m_0$ matrix with two adjacent diagonals of 1's having 0 in all other positions and $H_i$' is a $w*m_0 \times w*(n_0-m_0)$ matrix, where $H_i$' is a matrix obtained by interleaving rows of a block-diagonal matrix $H_i$'$^{(w)}$ having w matrices $H_i$ of dimension $m_0 \times (n_0-m_0)$ in the diagonal and 0 in all other positions, and $H_i$ is further chosen such that H=[$H_z$ $H_i$] is a parity check matrix of a code with length $n_0$, where $H_z$ is a $m_0 \times m_0$ matrix with two adjacent diagonals of 1's having 0 in all other positions.

9. A method for decoding a data message K' from a codeword c' received from a sending station, comprising:
   using a parity check matrix H' to decode the codeword c', where H'=[$H_z$' $H_i$'], $H_z$' is a $w*m_0 \times w*m_0$ matrix with two adjacent diagonals of 1's having 0 in all other positions, the codeword c' is of length $n=w*n_0$, where w and $n_0$ are integer numbers, and the codeword c' is generated by and/or mathematically writable as multiplication of the data message K' with a generator matrix G', c'=K'G', where the generator matrix G' is a solution of a matrix equation H'G'$^T$=0, and $H_i$' is a $w*m_0 \times w*(n_0-m_0)$ matrix obtained by interleaving rows of a block-diagonal matrix $H_i$'$^{(w)}$ having w matrices $H_i$ of dimension $m_0 \times (n_0-m_0)$ in the diagonal and 0 in all other positions, where H=[$H_z$ $H_i$] is a parity check matrix of a code with length $n_0$, and $H_z$ is a $m_0 \times m_0$ matrix with two adjacent diagonals of 1's having 0 in all other positions.

10. A receiving station, comprising
    at least one unit decoding a codeword c' received from a sending station, using a parity check matrix H' to decode the codeword c', where H'=[$H_z$' $H_i$'], $H_z$' is a $w*m_0 \times w*m_0$ matrix with two adjacent diagonals of 1's having 0 in all other positions, the codeword c' is of length $n=w*n_0$, where w and $n_0$ are integer numbers, and the codeword c' is generated by and/or mathematically writable as multiplication of the data message K' with a generator matrix G', c'=K'G', where the generator matrix G' is a solution of a matrix equation $H'G'^T=0$, and $H_i'$ is a $w*m_0 \times w*(n_0-m_0)$ matrix obtained by interleaving rows of a block-diagonal matrix $H_i'^{(w)}$ having w matrices $H_i$ of dimension $m_0 \times (n_0-m_0)$ in the diagonal and 0 in all other positions, where $H=[H_z\ H_i]$ is a parity check matrix of a code with length $n_0$, and $H_z$ is a $m_0 \times m_0$ matrix with two adjacent diagonals of 1's having 0 in all other positions.

11. At least one computer-readable medium encoded with a computer program for encoding a data message K' that when executed by a computer causes the computer to output a codeword c' from an input data message K', by a method comprising:

obtaining a matrix $H_i'$, where $H_i'$ is a $w*m_0 \times w*(n_0-m_0)$ matrix, by interleaving rows of a block-diagonal matrix $H_i'^{(w)}$ having w matrices $H_i$ of dimension $m_0 \times (n_0-m_0)$ in the diagonal and 0 in all other positions, where w and $n_0$ are integer numbers, $H=[H_z\ H_i]$ is a parity check matrix of a code with length $n_0$, and $H_z$ is a $m_0 \times m_0$ matrix with two adjacent diagonals of 1's having 0 in all other positions; and generating a codeword c' of length $n=w*n_0$ by and/or mathematically writable as multiplication of the data message K' with a generator matrix G', c'=K'G', where the generator matrix G' is a solution of a matrix equation $H'G'^T=0$, with $H'=[H_z'\ H_i']$, and $H_z'$ is a $w*m_0 \times w*m_0$ matrix with two adjacent diagonals of 1's having 0 in all other positions.

12. At least one computer-readable medium encoded with a computer program for decoding a codeword c', that when executed by a computer causes the computer to output a data message K' from an input codeword c', by a method comprising:

using a parity check matrix H' to decode the codeword c', where $H'=[H_z'\ H_i']$, is a $w*m_0 \times w*m_0$ matrix with two adjacent diagonals of 1's having 0 in all other positions, the codeword c' is of length $n=w*n_0$, where w and $n_0$ are integer numbers, and the codeword c' is generated by and/or mathematically writable as multiplication of the data message K' with a generator matrix G', c'=K'G', where the generator matrix G' is a solution of a matrix equation $H'G'^T=0$, and $H_i'$ is a $w*m_0 \times w*(n_0-m_0)$ matrix obtained by interleaving rows of a block-diagonal matrix $H_i'^{(w)}$ having w matrices $H_i$ of dimension $m_0 \times (n_0-m_0)$ in the diagonal and 0 in all other positions, where $H=[H_z\ H_i]$ is a parity check matrix of a code with length $n_0$, and $H_z$ is a $m_0 \times m_0$ matrix with two adjacent diagonals of 1's having 0 in all other positions.

* * * * *